(12) United States Patent
Lawson et al.

(10) Patent No.: US 7,064,580 B2
(45) Date of Patent: Jun. 20, 2006

(54) MASK-PROGRAMMABLE LOGIC DEVICE WITH PROGRAMMABLE PORTIONS

(75) Inventors: Jimmy Lawson, San Jose, CA (US); David Karchmer, Los Altos, CA (US); Marwan A. Khalaf, San Carlos, CA (US)

(73) Assignee: Altera Corporation, San Jose, CA (US)

( * ) Notice: Subject to any disclaimer, the term of this patent is extended or adjusted under 35 U.S.C. 154(b) by 133 days.

(21) Appl. No.: 10/897,735

(22) Filed: Jul. 22, 2004

(65) Prior Publication Data

US 2006/0017458 A1    Jan. 26, 2006

(51) Int. Cl.
*H03K 7/38* (2006.01)

(52) U.S. Cl. ............. 326/41; 326/39; 326/47; 326/101

(58) Field of Classification Search ........... 326/37–41, 326/47, 101
See application file for complete search history.

(56) References Cited

U.S. PATENT DOCUMENTS

| | | | |
|---|---|---|---|
| 5,825,202 A | 10/1998 | Tavana et al. | 326/39 |
| 5,874,834 A | 2/1999 | New | 326/39 |
| 6,091,262 A | 7/2000 | New | 326/39 |
| 6,094,065 A | 7/2000 | Tavana et al. | 326/39 |
| 6,242,945 B1 | 6/2001 | New | 326/39 |
| 6,490,707 B1 | 12/2002 | Baxter | 716/2 |
| 6,515,509 B1 | 2/2003 | Baxter | 326/39 |
| 6,526,563 B1 | 2/2003 | Baxter | 716/18 |
| 6,870,395 B1 * | 3/2005 | Schadt et al. | 326/41 |

OTHER PUBLICATIONS

Xilinx, *HardWire Data Book,* "XC3300 Family HardWire Logic Cell Arrays,"Preliminary Product Specification, 1991, no month.

Xilinx, *HardWire Data Book,* pp. 1-1 through 2-28, 1994, no month.

* cited by examiner

*Primary Examiner*—Anh Q. Tran
(74) *Attorney, Agent, or Firm*—Fish & Neave IP Group of Ropes & Gray LLP; Jeffrey H. Ingerman

(57) ABSTRACT

A mask-programmable logic device includes some circuitry that is electrically programmable as in conventional programmable logic devices. This allows a user to adjust certain characteristics of programmed devices whose logic functions have been proven and need not change, but which operate in an environment that changes, necessitating different characteristics, without having to redesign the programming metallization layers, and therefore without involving the device manufacturer. The programmable elements may include input/output elements, which may need adjustment because the signal characteristics of the larger system change, or clock circuitry, which may need adjustment because environmental conditions such as changes in the expected operating temperature may affect clock signals in the larger system.

40 Claims, 3 Drawing Sheets

MASK-PROGRAMMABLE LOGIC DEVICE WITH PROGRAMMABLE PORTIONS

BACKGROUND OF THE INVENTION

This invention relates to "hybrid" programmable logic devices having mask-programmable portions as well as field-programmable portions. More particularly, this invention relates to mask-programmable logic devices in which at least some of the input/output and/or clock circuitry is programmable by the user even after mask programming has occurred.

Programmable logic devices are well known. Early programmable logic devices were one-time configurable. For example, configuration may have been achieved by "blowing"—i.e., opening—fusible links. Alternatively, the configuration may have been stored in a programmable read-only memory. These devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up-table-type logic operations.

In all of the foregoing programmable logic devices, both the logic functions of particular logic elements in the device, and the interconnect for routing of signals between the logic elements, were programmable. More recently, mask-programmable logic devices ("MPLDs") have been provided. With MPLDs, instead of selling all users the same device, the manufacturer manufactures a partial device with a standardized arrangement of logic elements whose functions are not programmable by the user, and which lacks certain routing or interconnect resources.

The user provides the manufacturer of the MPLD with the specifications of a desired device, which may be the configuration file for programming a comparable conventional programmable logic device. The manufacturer uses that information to add metallization layers to the partial device described above. Those additional layers program the logic elements by making certain connections within those logic elements, and also add interconnect routing between the logic elements.

While conventional programmable logic devices allow a user to easily design a device to perform a desired function, a conventional programmable logic device invariably includes resources that may not be used for a particular design. Moreover, in order to accommodate general purpose routing and interconnect resources, and the switching resources that allow signals from any logic element to reach any desired routing and interconnect resource, conventional programmable logic devices grow ever larger as more functionality is built into them, increasing the size and power consumption of such devices. The routing of signals through the various switching elements as they travel from one routing and interconnect resource to another also slows down signals.

The advent of MPLDs has allowed users to prove a design in a conventional programmable logic device, but to commit the production version to an MPLD which, for the same functionality, can be significantly smaller and use significantly less power, because the only interconnect and routing resources are those actually needed for the particular design. In addition, those resources are simple metallizations, so there are no general purpose switching elements consuming space or power, or slowing down signals.

Although MPLDs have the foregoing advantages, it may happen from time to time that there is a change in the environment in which a programmed MPLD (i.e., a mask-programmed logic device) is used. A mask-programmed logic device almost invariably is used in a system including other components. It may happen, after the design of a mask-programmed logic device for use in such a system, that parameters of the system change in such a way that, while the logical operation of the mask-programmed logic device need not change, the input/output ("I/O") characteristics do change—e.g., because some other component of the system had to be changed. With known MPLDs, that would necessitate a redesign of the programming metallization layers to accommodate the new I/O characteristics, even though the logic has not changed.

Similarly, environmental changes may affect clock speeds in a way that requires adjustment of clock characteristics of an MPLD. Although it is known to allow the logic core of an MPLD to adjust clock characteristics of the device, those adjustments can be made only when the logic has been predesigned to make them. Therefore, unless the environmental condition requiring clock adjustments is foreseen, and the logic is designed to test for it so that it can be detected and acted upon, known MPLDs cannot accommodate environmental changes that affect clock characteristics.

Accordingly, it would be advantageous to be able to provide a mask-programmable logic device that provides the size and speed advantages of previously known mask-programmable logic devices, but also can more easily accommodate necessary changes resulting from environmental conditions.

SUMMARY OF THE INVENTION

In accordance with this invention, a mask-programmable logic device is provided that can more easily accommodate necessary changes, such as those described above that are necessitated by changes in the environment in which an already-designed, programmed MPLD is used. Specifically, while the logic implemented in an MPLD according to the present invention is fixed once the MPLD has been programmed by addition of the programming metallization layers, at least a portion, and preferably all, of the I/O and/or clock circuitry remains programmable by a user in the field. This allows a user to accommodate environmental changes without having to go back to the MPLD manufacturer/supplier for redesign of the programming mask layers.

The I/O circuitry of an MPLD according to the invention preferably is similar to or essentially the same as the programmable I/O circuitry of corresponding PLDs available from the same supplier, preferably having the ability to use various I/O signaling standards, including both single-ended and differential signaling standards. Similarly, the I/O circuitry preferably includes high-speed serial interface circuitry, which preferably incorporates clock-data recovery circuitry, to accommodate those signaling standards requiring such circuitry.

Because at least portions of the I/O circuitry are programmable, if circuit changes occur in the remainder of the system in which a programmed MPLD is being used, but the logic to be performed by the MPLD does not change, the user can adjust the I/O circuitry to accommodate the environmental changes. For example, changes in the system outside the MPLD may result in the need for a different drive strength or pull-up resistance on a particular I/O pin. The I/O buffer driving that pin can be adjusted as necessary in an MPLD according to the invention. The length, or even the inclusion at all, of a delay chain in a particular I/O path—e.g., to adjust set-up time or time to clock-out (TCO), also can be adjusted. Slew rate also may be adjusted. And it may be possible to turn off a particular I/O circuit altogether by tristating it.

Even a change in the I/O signaling standard used on a particular I/O pin may be possible, particularly if the signaling standard to which it is desired to change uses the same voltage level as the signaling standard previously used on that pin. A change to a different signaling standard using a different voltage may be possible if the programming metallization layers as designed for the first signaling standard can accommodate the new signaling standard.

In addition, if the original signaling standard is a differential signaling standard, the user can reprogram the I/O circuitry to use a single-ended signaling standard. The reverse also may be true, if additional pins are available. Similarly, if there is a change in the pinouts from the MPLD that are required or expected by the larger system, it may be possible to reassign I/O signals to different pins. Such reassignment, if available at all, likely would be limited to adjacent or nearby pins, depending on the degree to which individual I/O buffers include circuitry that connects with neighboring I/O buffers.

Although known MPLDs are not programmable after the programming metallization layers have been added, and thus are not field-programmable by users, it is known to provide in MPLDs components that are programmable during operation of the device. For example, the HardCopy™ line of MPLDs from Altera Corporation, of San Jose, Calif., include loop circuitry (e.g., phase-locked loops) for generating high-speed clock signals during device operation. During operation of the device, it may be necessary for the user logic to adjust operation of the loop circuit. Therefore, the loop circuitry is programmable, except that in previously known devices of this type, the user has no access to the configuration memory. Instead, the user logic core is given access to the configuration memory, known as the Configuration State Registers. However, the user logic core is fixed once the programming metallization layers are in place, so can change the loop circuitry only in ways that the user foresaw and provided the capability for in the programming.

In accordance with the present invention, the user also may be given access to the Configuration State Registers to make changes to the operation of the loop circuitry if called for by environmental changes. For example, clock speeds may need to be adjusted to accommodate clock speed changes either inside or outside the device resulting from a change in the expected ambient temperature of the operating environment, such as when a device designed for room temperature operation is redesigned for use at high temperatures. As another example, changes in the system outside the device, or dimensional changes inside the device resulting from the conversion from a conventional programmable logic device to an MPLD, may result in a phase mismatch between the clocks inside and outside the device, and therefore the user may need to adjust the clock phase.

In addition, according to the invention the Configuration State Registers preferably also are used to control as much of the I/O circuitry as is made programmable. One or more pins on the MPLD are provided for this purpose (possibly shared with one or more other functions), so that the user can program the I/O circuitry when necessary. Programming can be accomplished using conventional PLD programming tools provided by the manufacture/supplier of the MPLD, such as the QUARTUS® II programming software available from Altera Corporation.

Thus, in accordance with the present invention there is provided a mask-programmable logic device including an array of programmable logic elements. Each respective one of the logic elements has contacts for configuring that respective logic element to perform at least one logic function and for connection to an interconnect structure for interconnecting the logic elements. The mask-programmable logic device also includes at least one user-configurable element having contacts for connection to the interconnect structure for interconnecting the at least one user-configurable element and the logic elements, and being configurable by a user when necessitated by changes in environment outside the mask-programmable logic device.

The present invention includes not only the mask-programmable base device, but also the mask-programmed device after application of the programming metallization layer or layers.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1–3.

Figure 1:
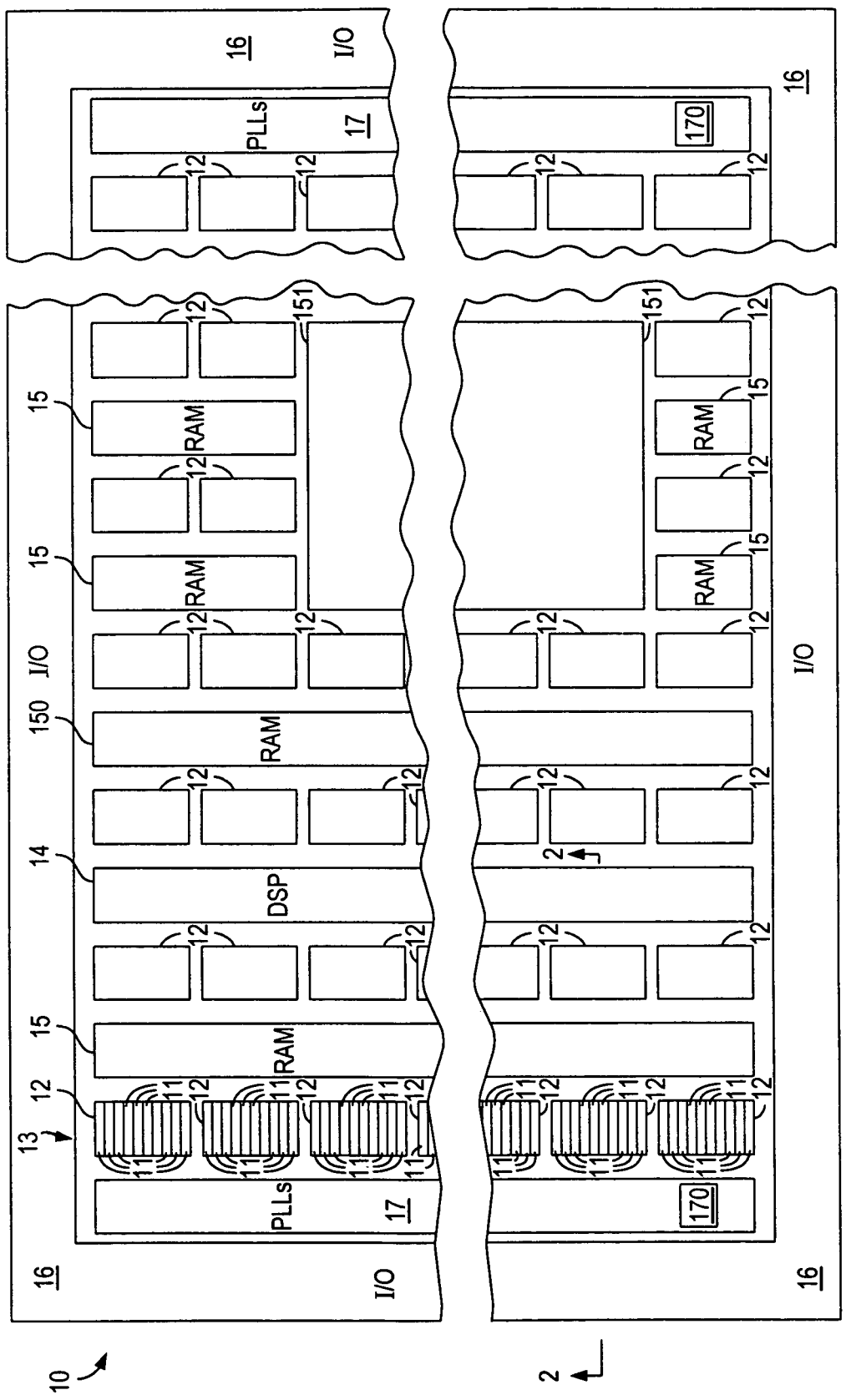
FIG. 1 is a fragmentary schematic representation of a mask-programmable logic device in accordance with the present invention.

FIG. 1 is representative of a mask-programmable logic device 10 from the HardCopy™ family of mask-programmable logic devices available from Altera Corporation, of San Jose, Calif., the assignee hereof. MPLD 10 itself includes an array of logic regions similar to those found in the STRATIX™ family of conventional programmable logic devices available from Altera Corporation. In summary, those logic regions include, at the most basic level, "logic elements" or "logic modules" (LEs) 11, which may be, for example, look-up-table-based logic regions having four inputs and a register providing the ability to have registered or unregistered output. Logic elements 11 may be grouped into "logic array blocks" (LABs) 12. In the embodiment shown, each LAB 12 includes ten LEs 11, although other numbers of LEs 11 could be grouped into each LAB 12. LABs 12 preferably are arranged in an orthogonal array, in rows and columns. Although only the LABs 12 in column 13 are shown divided into LEs 11, all LABs 12 are so divided.

Columns of LABs 12 preferably are separated by areas containing other types of circuitry. Thus, one area 14 between columns of LABs 12 may include a column of digital signal processing ("DSP") blocks (also known as multiplier-accumulator blocks, or MAC blocks). Columns of different types of random access memory ("RAM") also may be provided. In a preferred embodiment, some of the RAMs, such as those in columns 15, may be relatively small—e.g., 512 bytes, while others such as those in column 150 may be somewhat larger—e.g., 4K bytes. In addition, preferably interspersed less frequently throughout device 10 are much larger RAM areas 151 which may be 512K bytes. Each of these RAM areas can be used as memory—i.e., RAM or ROM—or may be configured as logic, particularly P-TERM-type logic.

Input/output elements preferably are located in regions 16 around the periphery of the array. Preferably, clock circuitry such as loop circuitry (e.g., phase-locked loops ("PLLs")) and other auxiliary circuits for timing, etc., preferably are provided at convenient locations within the array, such as in regions 17, shown at the right and left sides of the array.

It is to be understood from the fragmentary nature of FIG. 1 that device 10 is substantially larger, containing substantially more LABs 12, DSP areas 14, RAMs 15, 150 and 151, and other elements, than are present in FIG. 1.

Although the invention has been described up to now in terms of the HardCopy™ STRATIX™ family of devices, it should be noted that the invention also can be implemented on an MPLD or hybrid MPLD based on the building-block architecture of copending, commonly-assigned United States Patent Publication No. 2004/0111691, or the "hybrid logic element" of copending, commonly-assigned U.S. patent application Ser. No. 10/884,460, filed Jul. 2, 2004, each of which is hereby incorporated by reference herein in its respective entirety.

Device 10 represents the layout of a device that may be an unprogrammed mask-programmable logic device, without the programming metallization layers, or a plan of the logic layers of a programmed device in which the programming metallization layers are not shown. A cross-section of a mask-programmed version of device 10 is shown in FIG. 2. As seen in FIG. 2, a substrate 20 carries I/O regions 16, PLL region 17, LABs 12, DSP areas 14 and memory areas 15 (memory areas 150, 151 are not shown but also are carried by substrate 20). The particular shapes given to areas 12, 14, 16, 17 are for illustration purposes only and do not attempt to represent the true cross-sectional shapes of those areas. As part of those illustrative shapes, U-shaped areas 21 represent contacts where programming metallization layer 22 makes connections to interconnect those areas, while V-shaped areas 23 represent areas where programming metallization layer 24 makes connections to program the programmable features of those areas.

It should be noted that while areas 12, 14, 16, 17 are shown as monolithic areas, they are constructed from doped silicon layers and metallization layers that are not shown, as well as insulating layers between those layers, also not shown, as is well known in the art. In addition, programming metallization layers 22 and 24 are separated from those other layers, and from each other, by insulating layers that are not shown, as is well known in the art.

Figure 2:
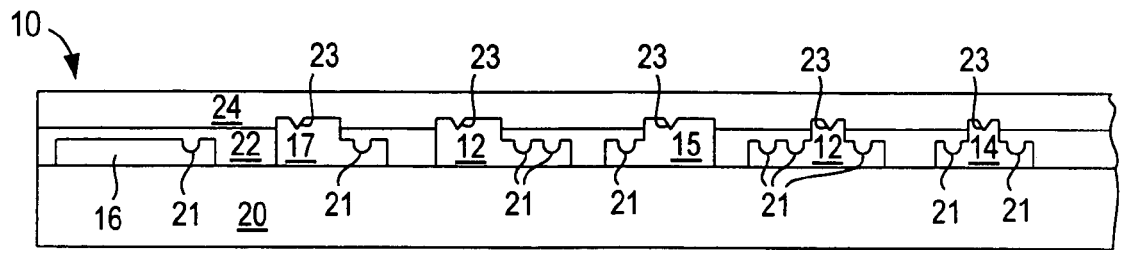
FIG. 2 is a schematic cross-sectional representation of a portion of a mask-programmed logic device in accordance with the present invention, taken from line 2—2 of FIG. 1.
Figure 3:
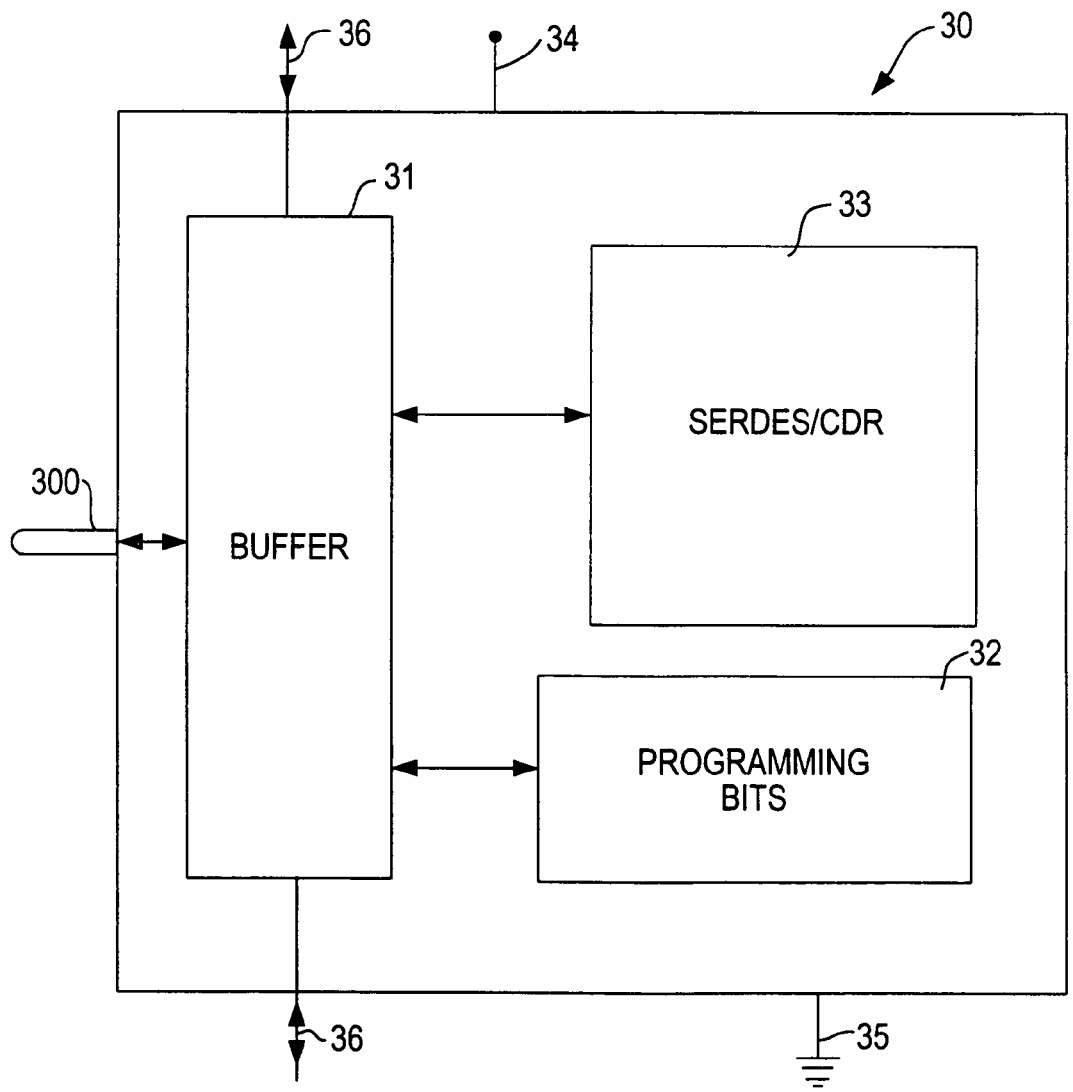
FIG. 3 is a schematic representation of a preferred embodiment of an input/output block for a mask-programmable logic device in accordance with the present invention.

As shown in FIG. 2, I/O areas 16 do not have any V-shaped areas 23. That is because, in accordance with one embodiment of the present invention, I/O areas 16 are not mask-programmable, but rather are electrically programmable as in a conventional PLD. A conceptual schematic representation of an I/O region 30, associated with an I/O pin 300, is shown in FIG. 3. The main component of I/O region 30 is programmable I/O buffer 31, having most of the functions described above, including the ability to handle different I/O standards (both single-ended and differential) at different voltages, as well as programmable pull-up, drive strength and slew rate controls. All of those functions are determined by the states of programming bits shown collectively at 32. Region 30 preferably also includes a serializer-deserializer (SERDES) module 33 with clock-data recovery (CDR) capability.

Connections to the device power supply 34 and ground 35 are provided through the structure of device 10 as is standard in integrated circuit devices. Connections 36 to neighboring I/O regions (not shown) are provided primarily to allow region 30 to borrow a pin 300 form a neighboring region 30 to accommodate a differential signaling standard. If the differential signaling standard is used by a particular pin 300 of device 10 as originally designed and programmed (including mask programming of most of device 10 and electrical programming of regions 30), and then because of a change in environment the programming of device 10 must be redesigned so that that pin 300 uses a single-ended signaling standard, there should be no difficulty in electrically reprogramming region 30 to accommodate that change. However, in a case where a single-ended signaling standard is used by a particular pin 300 of device 10 as originally designed and programmed (including mask programming of most of device 10 and electrical programming of regions 30), and then because of a change in environment the programming of device 10 must be redesigned so that that pin 300 uses a differential signaling standard, that could be more difficult if both of the neighboring pins 300 are used for other functions.

However, because connections 36 are provided, it may be possible to use those connections to direct signals—which are constrained by programming metallization layer 24 to arrive at a particular region 30 expecting access to a particular pin 300—to one of the neighboring regions 30 (and neighboring pin 300). This could free up a pin for use in differential signaling with a neighboring pin. This potential ability to redirect signals to neighboring regions 30 also may allow device pinouts to be changed slightly if environmental changes call for such change.

Although the programming bits for region 30 are shown as being clustered in area 32, in fact the programming bits are likely to be scattered around regions 30, or even located elsewhere in device 10. For example, in at least some members of the aforementioned HARDCOPY™ family of mask-programmable logic devices available from Altera Corporation, PLLs 17 are reprogrammable. Although the user of those devices does not have access to the programming bits for PLLs 17, the user logic does have such access, and may be able to change the characteristics of PLLs 17 through operation of logic in accordance with the user design. In those devices, the programming bits are stored in Configuration State Registers (CSRs), shown (illustratively only) as areas 170 in FIG. 1. In one preferred embodiment of the present invention, configuration bits 32 may be stored in CSRs 170.

Moreover, in accordance with the present invention, PLLs 17 may be programmable not only by the user logic, but also by the user, who in accordance with the invention may be given access to the CSRs for PLLs 17 instead of, or in addition to, the CSRs for I/O regions 16, 30. Although in FIG. 2, PLLs 17 are shown as having programming connections 23, those connections may be omitted in an embodiment where the user is given programming control over the PLLs 17. Or it may be that connections 23 are used to program some characteristics of PLLs 17, with the user programming being limited to other characteristics. The same may be true of I/O regions 16, 30, which may be provided with connections 23 (not shown) for that purpose.

The programming of configuration bits 32 is carried out by the user preferably using standard programming software such as the QUARTUS® software referred to above. One or more pins preferably are provided on device 10 for programming functions. As is well known in the art, the programming pins may be dedicated, or may have other functions during normal operation, with the programming function being invoked by applying special voltages to specified pins. The special voltages may be a particular pattern on a particular set of pins, or, more usually, an especially high voltage applied to a particular pin. The configuration bits may be loaded from a nonvolatile storage (e.g., flash memory) located on device 10, or, to save space on device 10, from an off-device source. Whether the configuration bits are loaded from on device 10 or off device 10 is one of the factors in determining whether the programming pins are dedicated or are shared with other uses.

Figure 4:
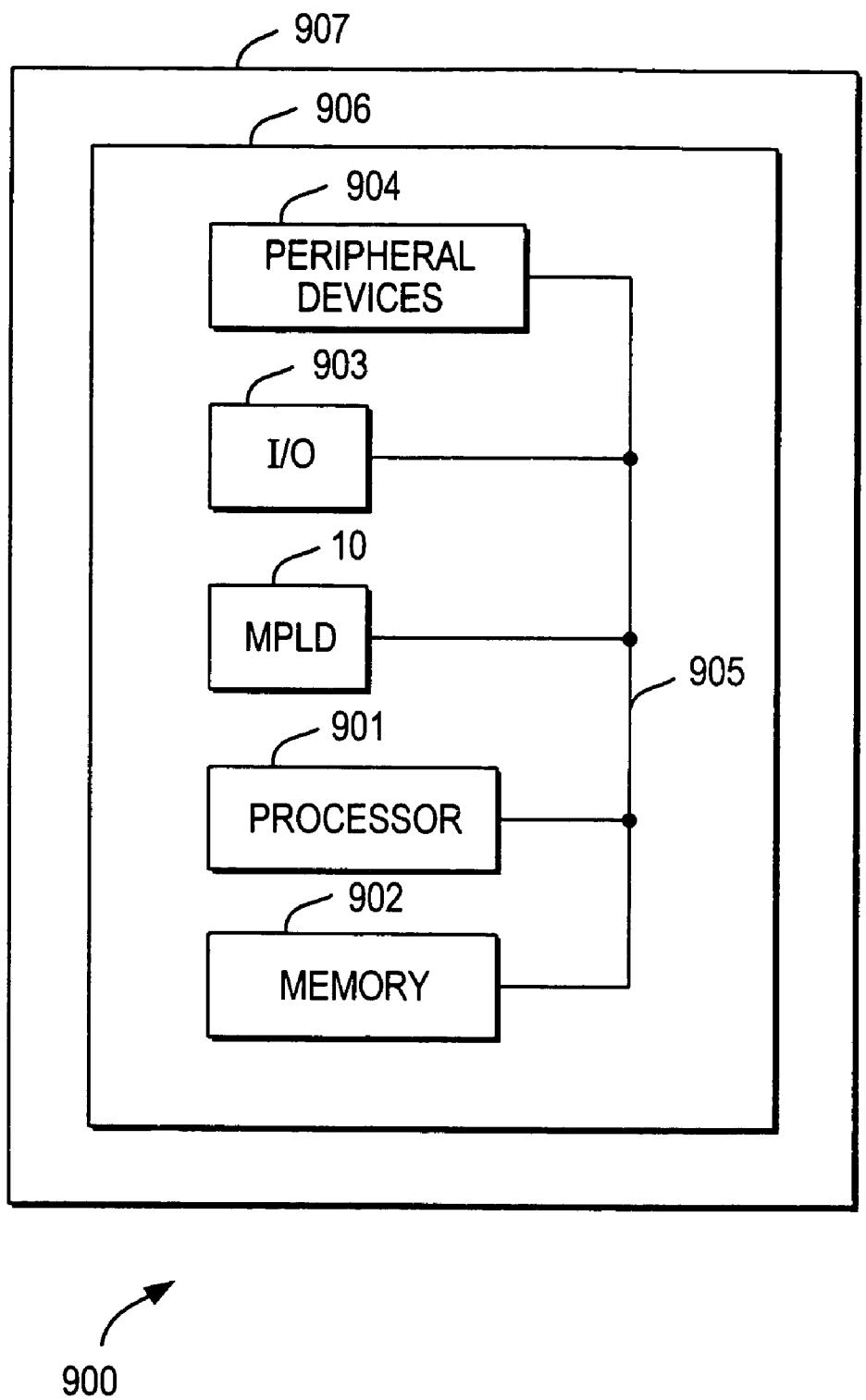
FIG. 4 is a simplified block diagram of an illustrative system employing a mask-programmed logic device in accordance with the present invention.

MPLD 10 according to the present invention may be used in many kinds of electronic devices. One possible use is in a data processing system 900 shown in FIG. 4. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. MPLD 10 can be used to perform a variety of different logic functions. For example, MPLD 10 can be configured as a processor or controller that works in cooperation with processor 901. MPLD 10 may also be used as an arbiter for arbitrating access to a shared resources in system 900. In yet another example, MPLD 10 can be configured as an interface between processor 901 and one of the other components in system 900. It should be noted that system 900 is only exemplary, and that the true scope and spirit of the invention should be indicated by the following claims.

Various technologies can be used to implement MPLDs 10 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A mask-programmable logic device comprising:
a programmable logic core including an array of programmable logic elements, at least one of said programmable logic elements having contacts for configuring said respective logic element to perform at least one logic function and for connection to an interconnect structure for interconnecting said logic elements; and
peripheral elements adjacent said programmable logic core, said peripheral elements including at least one user-configurable element having contacts for connection to said interconnect structure for interconnecting said user-configurable element and said logic elements, and being configurable by a user when necessitated by changes in environment outside said mask-programmable logic device.

2. The mask-programmable logic device of claim 1 wherein said peripheral elements comprise a plurality of input/output elements; wherein:
said at least one user-configurable element is one of said input/output elements which is user-programmable.

3. The mask-programmable logic device of claim 2 wherein all of said input/output elements are user-programmable.

4. The mask-programmable logic device of claim 3 further comprising:
functional elements that are programmable by operation of user logic in said mask-programmable logic device; and
configuration registers for programming said functional elements; wherein;
said configuration registers also are for programming said input/output elements.

5. The mask-programmable logic device of claim 3 wherein each said input/output element is user-programmable to change drive strength.

6. The mask-programmable logic device of claim 3 wherein each said input/output element is user-programmable to change pull-up resistance.

7. The mask-programmable logic device of claim 6 wherein each said input/output element is user-programmable to change pull-up resistance during configuration.

8. The mask-programmable logic device of claim 3 wherein each said input/output element is user-programmable to control slew rate.

9. The mask-programmable logic device of claim 3 wherein each said input/output element is user-programmable to tristate said input/output element.

10. The mask-programmable logic device of claim 3 wherein each said input/output element is user-programmable to select an input/output standard.

11. The mask-programmable logic device of claim 2 wherein said input/output element is user-programmable to change drive strength.

12. The mask-programmable logic device of claim 2 wherein said input/output element is user-programmable to change pull-up resistance.

13. The mask-programmable logic device of claim 12 wherein said input/output element is user-programmable to change pull-up resistance during configuration.

14. The mask-programmable logic device of claim 2 wherein said input/output element is user-programmable to control slew rate.

15. The mask-programmable logic device of claim 2 wherein said input/output element is user-programmable to tristate said input/output element.

16. The mask-programmable logic device of claim 2 wherein said input/output element is user-programmable to select an input/output standard.

17. The mask-programmable logic device of claim 1 comprising a plurality of clock circuits; wherein:
said clock circuits are programmable by operation of user logic in said mask-programmable logic device; and
at least one of said clock circuits is user-programmable.

18. The mask-programmable logic device of claim 17 wherein all of said clock circuits are user-programmable.

19. A mask-programmed logic device comprising:
a programmable logic core including an array of logic elements, at least one of said programmable logic elements having contacts for configuring said respective logic element to perform at least one logic function and for connection to an interconnect structure for interconnecting said logic elements;

peripheral elements adjacent said programmable logic core, said peripheral elements including at least one user-configurable element for configuration by a user when necessitated by changes in environment outside said mask-programmable logic device; and at least one programming metallization layer that: (a) programs said programmable logic elements, and (b) provides interconnections between and among said programmed logic elements and said at least one user-configurable element.

20. The mask-programmed logic device of claim 19 wherein said peripheral elements comprise a plurality of input/output elements; wherein:

each of said input/output elements has contacts for connection to said interconnect structure for interconnecting said input/output elements and said logic elements; and said at least one user-configurable element is one of said input/output elements which is user-programmable.

21. The mask-programmed logic device of claim 20 wherein all of said input/output elements are user-programmable.

22. The mask-programmed logic device of claim 21 further comprising:

functional elements that are programmable by operation of user logic; and configuration registers for programming said functional elements; wherein;

said configuration registers also are for programming said input/output elements.

23. The mask-programmed logic device of claim 21 wherein each said input/output element is user-programmable to change drive strength.

24. The mask-programmed logic device of claim 21 wherein each said input/output element is user-programmable to change pull-up resistance.

25. The mask-programmed logic device of claim 24 wherein each said input/output element is user-programmable to change pull-up resistance during configuration.

26. The mask-programmed logic device of claim 21 wherein each said input/output element is user-programmable to control slew rate.

27. The mask-programmed logic device of claim 21 wherein each said input/output element is user-programmable to tristate said input/output element.

28. The mask-programmed logic device of claim 21 wherein each said input/output element is user-programmable to select an input/output standard.

29. The mask-programmed logic device of claim 19 wherein said input/output element is user-programmable to change drive strength.

30. The mask-programmed logic device of claim 19 wherein said input/output element is user-programmable to change pull-up resistance.

31. The mask-programmed logic device of claim 30 wherein said input/output element is user-programmable to change pull-up resistance during configuration.

32. The mask-programmed logic device of claim 19 wherein said input/output element is user-programmable to control slew rate.

33. The mask-programmed logic device of claim 19 wherein said input/output element is user-programmable to tristate said input/output element.

34. The mask-programmed logic device of claim 19 wherein said input/output element is user-programmable to select an input/output standard.

35. The mask-programmable logic device of claim 19 comprising a plurality of clock circuits; wherein:

said clock circuits are programmable by operation of user logic in said mask-programmable logic device; and at least one of said clock circuits is user-programmable.

36. The mask-programmable logic device of claim 35 wherein all of said clock circuits are user-programmable.

37. A digital processing system comprising:

processing circuitry;

a memory coupled to said processing circuitry; and a mask-programmed logic device as defined in claim 34 coupled to the processing circuitry and the memory.

38. A printed circuit board on which is mounted a mask-programmed logic device as defined in claim 34.

39. The printed circuit board defined in claim 38 further comprising:

memory circuitry mounted on the printed circuit board and coupled to the mask-programmed logic device.

40. The printed circuit board defined in claim 39 further comprising:

processing circuitry mounted on the printed circuit board and coupled to the memory circuitry.

* * * * *